United States Patent [19]

Inoue et al.

[11] Patent Number: 6,072,115
[45] Date of Patent: Jun. 6, 2000

[54] SOLAR CELL MODULE AND SOLAR CELL INTEGRATED CLADDING ASSEMBLY

[75] Inventors: Yuji Inoue, Nara; Ichiro Kataoka, Kyotanabe; Fumitaka Toyomura, Kyotanabe; Satoru Shiomi, Kyotanabe; Makoto Sasaoka, Kyotanabe, all of Japan

[73] Assignee: Canon Kabushiki Kaisha, Tokyo, Japan

[21] Appl. No.: 09/221,874

[22] Filed: Dec. 29, 1998

[30] Foreign Application Priority Data

Jan. 6, 1998 [JP] Japan .................................. 10-000752

[51] Int. Cl.[7] .................................................. H01L 31/042
[52] U.S. Cl. ........................ 136/244; 136/251; 136/256; 136/259; 136/291; 257/433; 257/457; 257/459; 257/443; 257/448
[58] Field of Search ..................... 136/244, 251, 136/256, 259, 291; 257/433, 457, 459, 443, 448

[56] References Cited

U.S. PATENT DOCUMENTS 4,670,494  6/1987  Semenza, Jr. ........................ 524/141
4,892,683  1/1990  Naseem ............................... 252/609
5,589,006  12/1996  Itoyama et al. ..................... 136/248

FOREIGN PATENT DOCUMENTS 929106    7/1999   European Pat. Off. .
7-211932  8/1995   Japan .
7-302924  11/1995  Japan .

*Primary Examiner*—Alan Diamond
*Attorney, Agent, or Firm*—Fitzpatrick, Cella, Harper & Scinto

[57] ABSTRACT

A jacket material of electrical conductive leads for electrically connecting solar cell modules to each other is comprised of a polyvinyl chloride type resin containing either one of a polyester type plasticizer, a phosphoric acid ester type plasticizer, a fatty acid ester type plasticizer, and an epoxy type plasticizer, whereby the solar cell modules have excellent performance stability with less deterioration of the electrical conductive leads even when the electrical conductive leads are kept in contact with a base member such as an organic waterproof sheet over a long period.

30 Claims, 9 Drawing Sheets

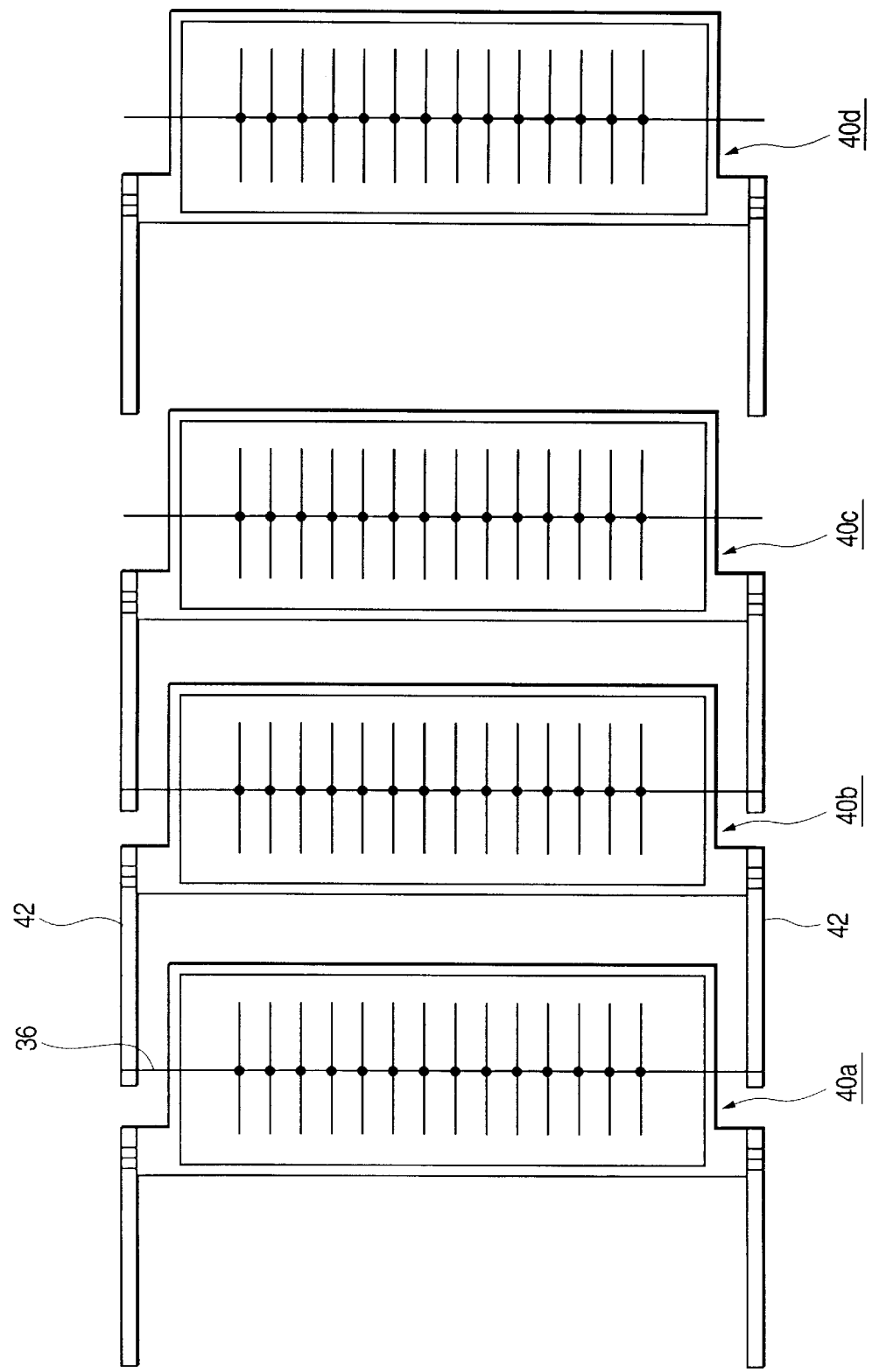

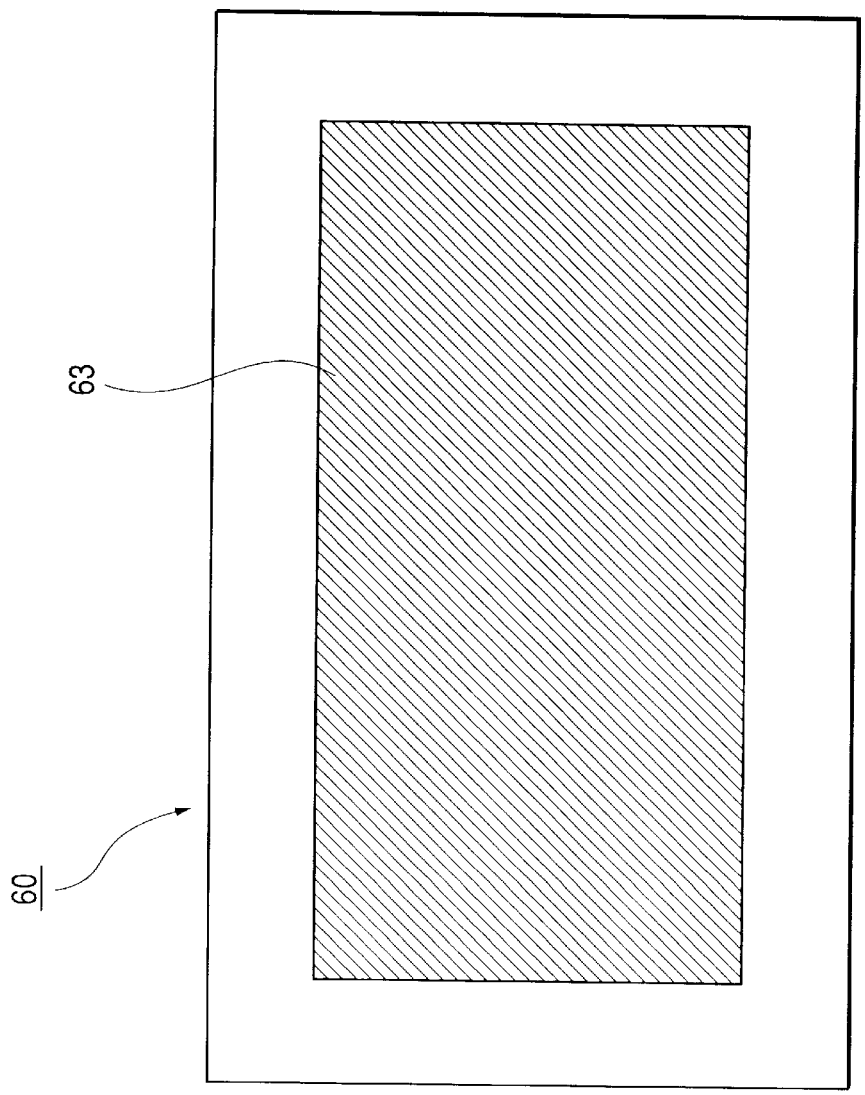
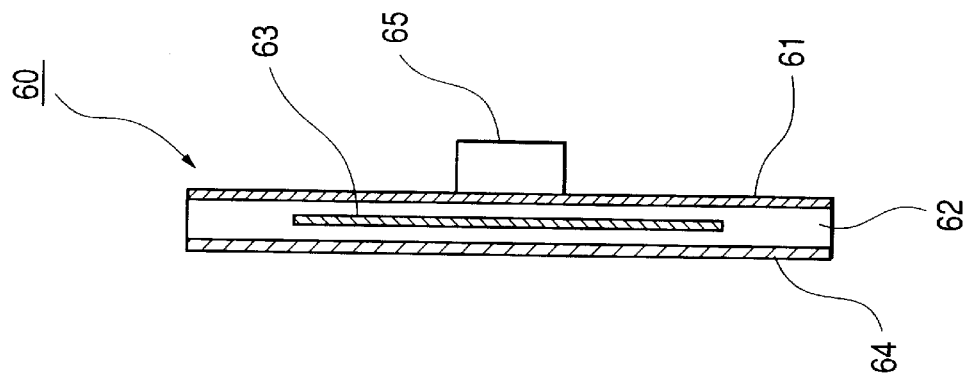
FIG. 4A
FIG. 4B

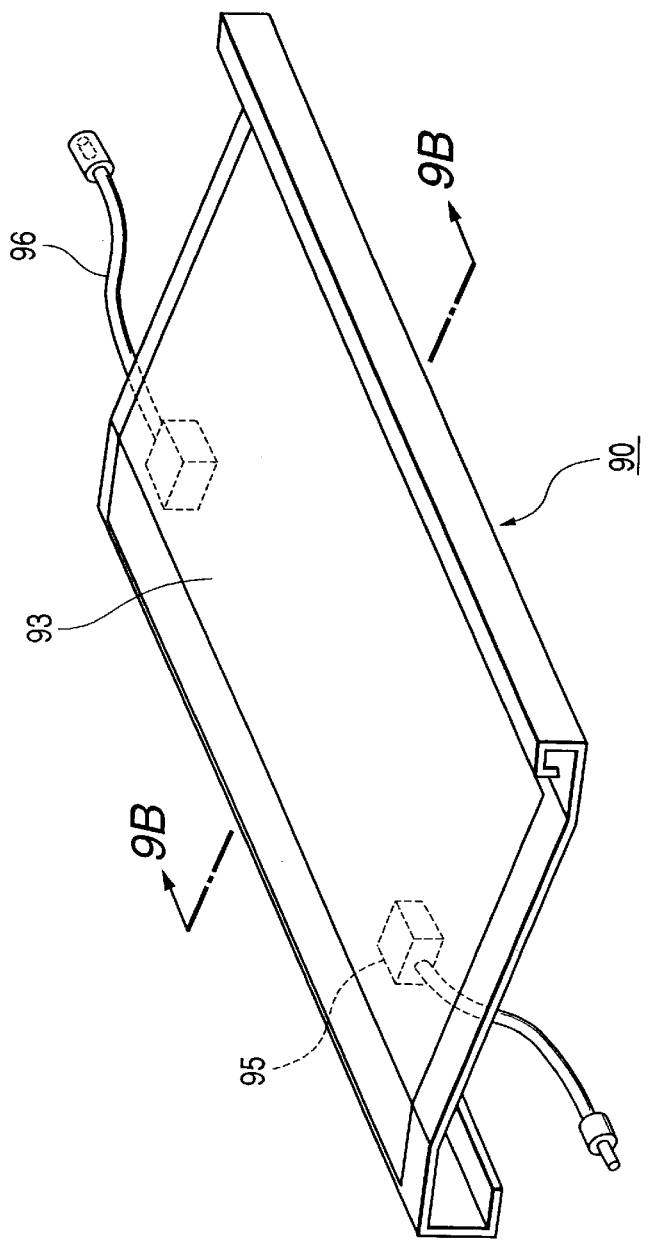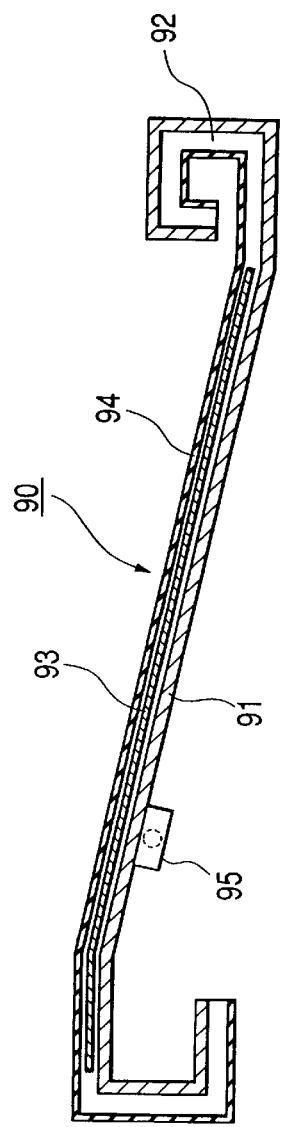
FIG. 9A
FIG. 9B

SOLAR CELL MODULE AND SOLAR CELL INTEGRATED CLADDING ASSEMBLY

BACKGROUND OF THE INVENTION

1. Field of the Invention

The present invention relates to a solar cell module with excellent long-term reliability and a solar cell integrated cladding assembly with excellent long-term reliability in which a solar cell module is mounted on a base member.

2. Related Background Art

As people's awareness is increasing about ecology in recent years, solar cells become more and more expected as a clean energy source. Particularly, examples of installation on tiled roofs of houses and on roofs and walls of buildings are also increasing year after year.

In addition to the solar cells installed on the roofs of houses, development and construction is also extensively being made in modules integrated with the roof or the wall, such as building material/roof integrated solar cell modules or building material/wall integrated solar cell modules.

For example, Japanese Patent Application Laid-Open No. 7-211932 describes a solar cell module integrated roof material of the batten seam type to be mounted through spacer members on a base member of wood, mortar, cement, or the like. In this example, the adjacent solar cell modules of the batten seam type are electrically connected to each other by connector integrated cords in the space between the solar cell modules and the base member.

In Japanese Patent Application Laid-Open No. 7-302924 discloses a plurality of horizontally roofing type solar cell integrated roof plates are mounted on the roof member, wherein wires for electrically connecting adjacent solar cell integrated roof plates are set through the space between the roof member and the horizontally roofing type solar cell integrated roof plates. In the case of such solar cell integrated roof plates, the wires for electrically connecting the adjacent solar cell integrated roof plates, i.e., connectors and connection cables, are connected in the space between the base member, such as a sheathing roof board, and the solar cell integrated roof plates.

As described above, in the case where the solar cell modules are mounted on the base member and the adjacent solar cell modules are connected by connection wires such as cables and connectors, it is common practice to employ a method of successively mounting the solar cell modules on the base member while wiring the connection wires of the adjacent solar cell modules in the space between the base member and the solar cell modules.

Specifically, for example, after an eaves-side solar cell module is fixed on a frame or the like, connection wires of the eaves-side solar cell module and a ridge-side solar cell module immediately above it are electrically connected, for example, through connectors or the like in the space between the base member and the solar cell modules, and then the ridge-side solar cell module is also fixed to the frame.

However, in this installation method, it was difficult to conduct the work of electrical connection, because the space was narrow between the base member and the solar cell modules and because the connecting work was not allowed to be carried out on the front surface side but had to be carried out on the back surface side of the modules. Further, the work became harder at low temperatures in winter, because the cables and connectors became hard.

Further, since the connecting work of connection wires had to be carried out in the narrow space, the connection wires were sometimes pulled by force and excessive force was sometimes exerted on the connection wires and the connecting parts between the solar cell modules and the connection wires. There were some cases where the connection wire was detached from the solar cell module.

Thus, it is conceivable to increase the length of the connection wires of the solar cell modules so as to facilitate the connecting work of the connection wires between the solar cell modules in terms of operability and reliability. However, the increase of the length of the connection wires of the solar cell modules inevitably makes the connection wires such as output leads of the solar cell modules more likely to be in contact with the base member.

In general, plastics such as polyvinyl chloride and polyethylene resins are popularly used in the field of wire covering. Among such plastics, polyvinyl chloride resin demonstrates flexibility, which is hardly achieved by the other plastics, when blended with a plasticizer, and it has well-balanced electrical, physical, and chemical properties and high workability and coloring characteristics as well. Further, polyvinyl chloride resin is relatively inexpensive and thus is also used for the cables of the solar cell modules. A typical plasticizer for polyvinyl chloride is di(2-ethylhexyl) phthalate (DOP; dioctyl phthalate), which is widely used in terms of well-balanced performance and price.

The inventors, however, found that in the case of a solar cell integrated cladding assembly in which the solar cell modules were mounted on the base member and were electrically connected in the space between the base member and the solar cell modules, there arose no problem where the connection wires of the solar cell modules were not in contact with the base member but there arose the following problem where the connection wires of the solar cell modules were physically in contact with the base member.

Specifically, the inventors have found that where the electrical connection wires of polyvinyl chloride type resin containing a phthalic acid ester type plasticizer were kept in contact over a long period with the base member of asphalt type resin, polyvinyl chloride type resin, polystyrene type resin, polyurethane type resin, or the like used mainly for waterproofing and where they were placed under severe conditions, the electrical connection wires were deteriorated to degrade the performance of the solar cell modules.

SUMMARY OF THE INVENTION

An object of the present invention is, therefore, to provide a solar cell module with high long-term reliability and also provide a solar cell integrated cladding assembly with high long-term reliability and with little deterioration of electric connection wires even under such circumstances that the electric connection wires of the solar cell module are kept in contact with the base member over a long period.

According to the present invention, there is provided a solar cell module comprising a plurality of solar cell elements connected in series or in parallel, wherein a jacket material (or covering material) of an electrical conductive lead for electrically connecting the solar cell module with another solar cell module comprises a polyvinyl chloride type resin comprising at least one of a polyester type plasticizer, a phosphoric acid ester type plasticizer, a fatty acid ester type plasticizer, and an epoxy type plasticizer.

According to the present invention, there is further provided a solar cell integrated cladding assembly having mounted on a base member a plurality of solar cell modules each comprising a plurality of solar cell elements connected in series or in parallel, the plurality of solar cell modules being connected in series or in parallel by an electrical conductive lead, wherein the plurality of solar cell modules are electrically connected by the electrical conductive lead between the base member and the solar cell modules, and wherein a jacket material of the electrical conductive lead comprises a polyvinyl chloride type resin comprising at least one of a polyester type plasticizer, a phosphoric acid ester type plasticizer, a fatty acid ester type plasticizer, and an epoxy type plasticizer.

In the solar cell integrated cladding assembly to accomplish the above object, extremely prominent effect is demonstrated, particularly, where the base member is of a material comprising one or two or more selected from asphalt type resin, polyvinyl chloride type resin, polystyrene type resin, and polyurethane type resin.

BRIEF DESCRIPTION OF THE DRAWINGS

FIG. 3 is a schematic plan view showing a state in which a plurality of solar cell elements are connected;

FIG. 4A is a schematic plan view showing an example of a solar cell module;

FIG. 4B is a schematic sectional view showing an example of a cross section of a solar cell module;

FIG. 9A is a schematic perspective view showing an example of bending of a solar cell module;

FIG. 9B is a schematic sectional view taken along the line 9B—9B of FIG. 9A;

DESCRIPTION OF THE PREFERRED EMBODIMENTS

Figure 1:
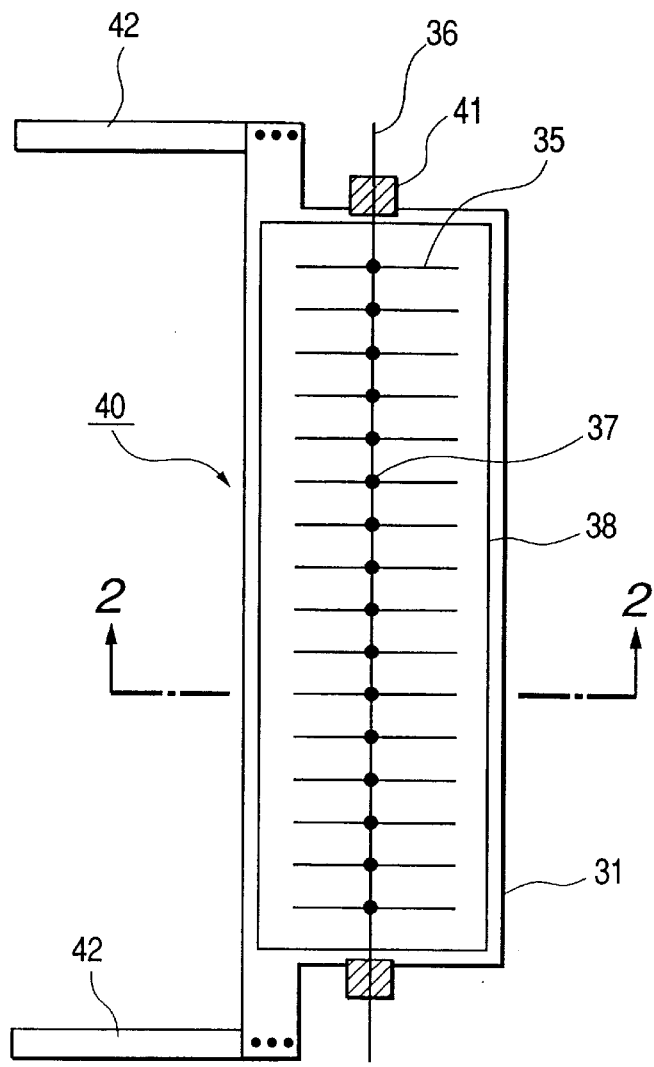
FIG. 1 is a schematic plan view showing an example of a solar cell element.

The present invention will be described in detail.
(Electrical conductive lead)

The term "electrical conductive lead" as used in the specification and claims refers to a connecting member such as a connection wire and a connector, for electrically connecting solar cell modules to each other, and a jacket material thereof is comprised of the polyvinyl chloride type resin. The cover for the electrical conductive lead may be multiple coatings and in the case of the multiple coatings at least the outermost jacket material thereof is comprised of the polyvinyl chloride type resin.

Here, the plasticizer contained in the polyvinyl chloride type resin is preferably a plasticizer except for DOP (di(2-ethylhexyl) phthalate), more preferably a plasticizer except for phthalic acid ester type plasticizers, and particularly preferably a polyester type plasticizer, a phosphoric acid ester type plasticizer, a fatty acid ester type plasticizer, and an epoxy type plasticizer.

The electrical conductive lead having the jacket material of the polyvinyl chloride type resin containing either of these plasticizers assures the long-term reliability, because there occurs less volatilization of the plasticizer from the polyvinyl chloride type resin and less migration of the plasticizer into the base member, thus enabling it to suppress hardening of the electrical conductive lead due to decrease of the plasticizer and deterioration of the base member due to the migration of the plasticizer.

Specific examples of the applicable plasticizers are as follows. There are no specific restrictions on the polyester type plasticizer, but there can be used a sebacic acid type polyester plasticizer, an adipic acid type polyester plasticizer, a phthalic acid type polyester plasticizer, and so on. The polyester plasticizers that can be used preferably are those having a molecular weight of 500 to 10000.

If the molecular weight is less than 500, the plasticizer will become more likely to migrate to the base member. If the molecular weight is over 10000, the compatibility with the polyvinyl chloride resin will become more likely to be degraded. Taking the compatibility with the polyvinyl chloride resin and the volatilization into consideration, particularly preferred polyester type plasticizers are those having the molecular weight of 1000 to 5000.

There are no specific restrictions on the phosphoric acid ester type plasticizer, but there can be used tricresyl phosphate, trioctyl phosphate, and so on.

There are no specific restrictions on the fatty acid ester type plasticizer, but there can be used tri-n-butyl citrate, dioctyl adipate, dioctyl azelate, dioctyl sebacate, methyl acetylricinoleate, and so on.

There are no specific restrictions on the epoxy type plasticizer, but there can be used alkyl epoxy stearate, epoxidized soybean oil, isodecyl 4,5-epoxytetrahydrophthalate, and so on.

Further, a connector or the like may be provided at the connection end of the electrical conductive lead. There are no specific restrictions on the jacket material of the connector, but there can be used polyvinyl chloride resin, polyethylene resin, polyamide resin, polyvinylidene fluoride resin, chloroprene rubber, ethylene propylene rubber, silicone resin, fluororesin, modified PPO resin, modified PPE resin, nylon resin, polycarbonate resin, polybutylene terephthalate resin, polypropylene resin, and so on.

Here, when the polyvinyl chloride resin is used for the jacket material of the connector, the plasticizer for the polyvinyl chloride is preferably the polyester type plasticizer, the phosphoric acid ester type plasticizer, the fatty acid ester type plasticizer, or the epoxy type plasticizer, for the same reason as described above.
(Base member)

The base member used in the solar-cell-integrated cladding assembly of the present invention is used for the purpose of structurally supporting the cladding assembly of building such as the roof or the wall and for the purposes of waterproofing, heat insulation, and so on, and is a material located inside the outermost cladding assembly.

There are no specific restrictions on the base member, but it is preferably a material containing one or two or more of the asphalt type resin, the polyvinyl chloride type resin, the polystyrene type resin, and the polyurethane type resin, taking account of waterproofing, durability, cost, and general versatility. Specifically, there can be used, for example, a heat insulator board, a waterproofing sheet, and so on.

Examples of heat insulators include "polystyrene foam (of a board shape)," "hard polyurethane foam (of a board shape)," and so on.

There are two types of the polystyrene foam (of the board shape), depending upon the difference of production process, i.e., one-shot foam by a continuous extrusion foaming (extrusion polystyrene foam) and two-shot foam by a fusion molding of beads of one shot foam (bead-process polystyrene foam). There can be used, for example, "Kanelite Foam" and "Baritac" (trade names) available from KANEKA CORP., "Styrofoam" (trade name) available from DOW KAKOH K.K., "Mirafoam" (trade name) available from JSP Corp., "Esren Foam" (trade name) available from Sekisui Plastics Co., Ltd., and so on.

The "hard polyurethane foam (of the board shape)" is generally a heat insulator obtained by molding a foam body resulting from a chemical reaction of polyol, isocyanate, and a foaming agent, into a board shape, and has features of a small thermal conductivity and high thermal insulation properties because of use of a flon gas as a foaming agent. Specific products include a sandwich-like foam in which urethane resin is foamed in a plate shape of a predetermined thickness between two sheet members by making use of the adhesive property of the urethane resin, a urethane foam shaped by cutting out of a large block, and so on. There can be used, for example, "Everlite Panel" and "Everlite Board" (trade names) available from BRIDGESTONE CORP., "Achilles Board" and "Achilles Hinon" (trade names) available from Achilles Corp., "Foam Lite" and "Thermax" (trade names) available from INOAC CORPORATION, "Kuran Panel" (trade name) available from KURABO INDUSTRIES LTD., "Soflan Panel" (trade name) available from Toyo Rubber Co., Ltd., "Iso Band" (trade name) available from DAIDO STEEL SHEET CORP., and so on.

Further, as the base member for the roof or the like, a roof underlayment can be mounted for shutting rain water that cannot be prevented only by the roofing such as the sheathing roof board. As specific examples of this roof underlayment, there can be used sheet materials, foamed plastic products, and so on.

As the sheet materials, there can be used specifically "asphalt roofing materials," "improved asphalt type materials," "synthetic resin type materials," and so on.

The "asphalt roofing materials" are classified under an asphalt roofing and an asphalt felt. The former is obtained by impregnating a special paper sheet called a roofing base paper with straight asphalt and applying blown asphalt onto the surface thereof. Examples of the asphalt roofing that can be used in the present invention include "Mitsuboshi Asphalt Roofing" (trade name) available from TAJIMA ROOFING CO., LTD., "Asphalt Roofing" (trade name) available from Nanaou Kogyo K.K., "Asphalt Roofing" (trade name) available from NISSHIN KOGYO CO., LTD., and so on. The latter is obtained by impregnating the roofing base paper with straight asphalt and examples thereof include "Mitsuboshi Asphalt Felt" (trade name) available from TAJIMA ROOFING CO., LTD., "Asphalt Felt" (trade name) available from Nanaou Kogyo K.K., "Asphalt Felt" (trade name) available from NISSHIN KOGYO CO., LTD., and so on.

The "improved asphalt type materials" are materials obtained by blending an appropriate amount of a synthetic rubber or synthetic resin compatible with asphalt, into the asphalt, thereby modifying the asphalt so as to enhance low-temperature characteristics, high-temperature characteristics, nail hole sealability, stickiness, durability, and so on. Examples of such improved asphalt type materials include a material obtained by using nonwoven fabric of a synthetic fiber as a reinforcing material and applying the improved asphalt onto the both surfaces or either one surface thereof, a material obtained by laminating the improved asphalt between two fibrous sheets, and so on. Examples of such materials that can be used in the present invention include "Underroof K," "Liner Roofing," "Undergumlon MG base M," "Undergumlon MG base F," "Undergumlon MG base B," and "Home Roof" (trade names) available from TAJIMA ROOFING CO., LTD., "Morasun No. 1," "Morasun No. 2," "Morasun Ace," "Bester No. 1," "Bester No. 2," "Morasun ALC," and "Morasun No. 3" (trade names) available from Nanaou Kogyo K.K., "Color House Roof," "Ban Color Roof," "House Roof No. 2," "House Roof No. 3," and "Custom SA" (trade names) available from NISSHIN KOGYO CO., LTD., "Yane Roof," "Aquacut RR2100," "Aquacut SS15R," "Aquacut SS20I," and "Aquacut ZR20T" (trade names) available from Ube Industries, Ltd., "Superbird G520" and "Superbird G220" (trade names) available from Shizuoka Rekisei Kogyo K.K., "Toho GA Roof B-3," "Toho GA Roof B-4," "Toho GA Roof B-5," and "Toho GA Roof B-10" (trade names) available from Toho Perlite K.K., "Mikeron Shitaji Sheet 2000" and "Mikeron Shitaji Sheet 3000" available from HAYAKAWA RUBBER CO., LTD., and so on, but it is noted that the materials are not limited to these examples.

Further, the "synthetic resin type materials" are, for example, polyvinyl chloride and it can be used in the form of a sheet alone or in the form of a lamination with another material (kraft paper, nonwoven fabric, asphalt, coal tar, asphalt felt, etc.).

Specific examples of the synthetic resin type materials include "Hitonton," "Hi Guard," and "Full Best Sheet" (trade names) available from Matsushita Electric Works, Ltd., "Sunroof King" and "Sunroof Kakiita" (trade names) available from Sunroof Kogyo K.K., "Suntac Roof TY" (trade name) available from HAYAKAWA RUBBER CO., LTD., "Tipec" available from Du Pont Japan LTD., "Nitoroof," "Zenten Sheet GR," and "Zenten Sheet GRA" (trade names) available from NITTO DENKO CORP., and "Dohtomi Champion" (trade name) available from TOTO SPACE LTD.

The foamed plastic products are used for the purpose of the effect such as heat insulation, prevention of dew condensation, or insulation of rain sound, and examples thereof that can be used include "Mirawoody" (trade name) available from JSP Corp., "Asfoam II" (trade name) available from TAJIMA ROOFING CO., LTD., "Banmatt No. 1" (trade name) available from NISSHIN KOGYO CO., LTD., "Foamnard Panel" (trade name) available from NICHIAS CORP., "Yukaroof" (trade name) available from Yuka Roof K.K., and so on.

(Solar cell element)

There are no specific restrictions on the solar cell elements used in the solar cell module of the present invention. As the cell elements using silicon semiconductors, there can be used single-crystal silicon solar cells, polycrystal silicon solar cells, amorphous silicon solar cells, and so on. As the cell elements using compound semiconductors, there can be used Group III-V compound solar cells, Group II-VI compound solar cells, Group I-III-VI compound solar cells, and so on.

The solar cell elements used in the present invention are preferably the amorphous silicon solar cells. Since the amorphous silicon solar cells can be formed in thin films on a film substrate or on an electroconductive substrate, the solar cells themselves can be lightweight. Particularly, the amorphous silicon solar cells using the electroconductive substrate have high structural strength and bendability and thus have high degrees of freedom of the shape, so that they can be adapted to a variety of roof shapes and wall shapes.

(Solar cell module)

The solar cell module of the present invention is constructed of a plurality of above-stated solar cell elements connected in series or in parallel and these solar cell elements are normally sandwiched through a filler between a surface protecting member and a back surface reinforcing member.

When the solar cell module is made using glass as a surface protecting material, and when the module itself is mounted on a structure such as a base member, it is essential to provide an intermediate member such as a frame between the solar cell module and the structure.

On the other hand, when the solar cell module is constructed in the structure in which the amorphous silicon solar cells using the electro-conductive substrate are sandwiched between a weather-resistant film (surface protecting member) and a metal sheet (back surface reinforcing member), it can be shaped, for example, in the folded plate shape, the batten seam shape, or the horizontal-roofing shape, similar to the metal roof, and can therefore be installed directly on the base member, thus forming a full-fledged, building material integrated solar cell module. Since the solar cell module of this type can also have the function as a metal roof, the total cost can be low, it can be processed in the similar shape to the conventional metal roof in terms of appearance, and freedom of design can be increased without posing a sense of incompatibility with the existing buildings.

Further, when the weather-resistant film is used as the surface protecting material for the solar cell module, the weight of the solar cell module can be reduced and the weight of the roof itself is decreased thereby, so that damage can be reduced in the event of an earthquake and the like.

In the solar cell module of the present invention, by using as the jacket material of the electrical conductive lead, the polyvinyl chloride type resin containing either one of the polyester type plasticizer, the phosphoric acid ester type plasticizer, the fatty acid ester type plasticizer, and the epoxy type plasticizer as described previously, it is possible to prevent deterioration of the electric connection wire, particularly, even if the electric connection wire is brought into contact with the waterproofing base member of the asphalt type resin, the polyvinyl chloride type resin, the polystyrene type resin, the polyurethane type resin, or the like, so that the performance of the solar cell module can be prevented from lowering.

Since the solar cell module of the present invention can be installed with the electric connection wire being in contact with the base member as described above, the length of the electric connection wire can be made large, whereby excessive force is prevented from being exerted on the connecting part between the solar cell body and the connection wire on the occasion of installation of the solar cell module on the base member, which improves the installation operability of the solar cell module.

Further, since the solar cell module of the present invention can be installed with the electric connection wire being in contact with the base member, the building material integrated solar cell module described above can be installed directly on the base member. This can obviate the necessity for the frame and spacer members, which were hitherto necessary between the solar cell module and the base member, particularly, even when the solar cell module is installed on a waterproof sheet such as the asphalt roofing.

Therefore, the solar cell integrated cladding assembly of the new type can be constructed.

EXAMPLES

The present invention will be described in further detail with examples thereof, but it should be noted that the present invention is by no means intended to be limited to these examples.

Example 1

The present example is an example in which each solar cell module is constructed by connecting in series the amorphous silicon solar cell elements made on a stainless sheet substrate and sealing them with a weather-resistant resin with a GALUVALUME (trade name of an aluminum zinc alloy coated steel sheet) steel sheet provided on the back surface, each module is bent in a batten-seamed roof shape, and the two building material integrated solar cell modules thus obtained are mounted through a space on the base member and in which parts of cables coming out of the back surfaces of the solar cell modules are forced to touch the base member. The details will be described below.

Figure 2:
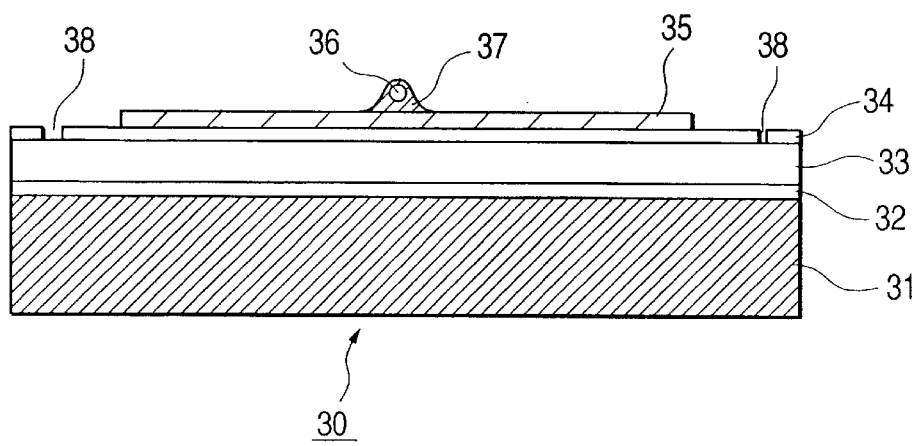
FIG. 2 is a schematic sectional view taken along the line 2—2 of FIG. 1.

Procedures for producing an amorphous silicon solar cell 30 will be first described referring to FIGS. 1 and 2.

On a cleaned long stainless steel substrate (electroconductive substrate 31) of a roll shape having a thickness of 0.1 mm, a layer of Al containing 1% of Si (back surface reflecting layer 32) was formed in a thickness of 5000 Å by sputtering. Then an n/i/p-type amorphous silicon semiconductor layer (semiconductor layer 33) was formed in such a way that an n-type semiconductor layer, an i-type semiconductor layer, and a p-type semiconductor layer were successively formed 300 Å, 4000 Å, and 100 Å thick, respectively, by the plasma CVD method using gases of $PH_3$, $SiH_4$, and $H_2$ for the n-type semiconductor, gases of $SiH_4$ and $H_2$ for the i-type semiconductor, and gases of $B_2H_6$, $SiH_4$, and $H_2$ for the p-type semiconductor.

After that, a layer of ITO (transparent conductive layer 34) was formed in a thickness of 800 Å by resistance heating evaporation, thereby forming the amorphous silicon solar cell element. Then the long solar cell element made as described above was punched into the shape as illustrated in FIG. 1 by use of a press machine, thereby making a plurality of solar cell strips 40. In the cut surfaces of the solar cell strips 40 thus formed by the press machine, the solar cell strips 40 were crushed to bring about a short circuit between the ITO electrode 34 and the stainless steel substrate 31.

For electrically isolating the ITO electrode 34 and the stainless steel substrate 31 in the short-circuited state, an isolation section 38 was thus next provided in the peripheral part of the ITO electrode 34 of each solar cell element as illustrated in FIGS. 1 and 2, so that this isolation section 38 was used for removal of the peripheral part of the ITO electrode 34. This created a power generating region, and a non-power-generating region in the peripheral part. Removal of ITO was carried out specifically as follows. First, an etchant having such etch selectivity as to dissolve ITO but not to dissolve the amorphous silicon semiconductors (e.g., $FeCl_3$ solution) was screen-printed on the periphery of ITO slightly inside the cut surface of each solar cell strip 40 to dissolve ITO and thereafter each strip was cleaned with water, thereby forming the isolation section 38 of the ITO electrode 34.

Then a silver paste containing a binder of polyester resin ("5007" available from Du Pont Company) was screen-printed as grid electrodes 35 for collection of electricity on the ITO electrode 34. Then a tin-plated copper wire 36 as a collector electrode for the grid electrodes 35 was placed perpendicularly to the grid electrodes 35. After that, "C-220" available from EMARSON & CUMING, INC as adhesive silver ink 37 was dropped onto intersecting points with the grid electrodes 35 and then was dried at 150° C. for 30 minutes, thereby connecting the grid electrodes 35 with the tin-plated copper wire 36. On that occasion, polyimide tape 41 was attached to the stainless steel substrate 31 beneath the tin-plated copper wire 36 in order to prevent the tin-plated copper wire 36 from touching the end faces of the stainless steel substrate 31.

Then parts of the ITO layer/a-Si layer in the non-power-generating region were removed by a grinder in the above solar cell strip 40 having the amorphous silicon solar cell elements to expose the stainless steel substrate 31 and thereafter copper foils 42 were welded to the exposed portions by a spot welder. FIG. 2 is a schematic cross section taken along the line 2—2 in FIG. 1.

Then the above solar cell strips were connected in series by soldering the tin-plated copper wire 36 of solar cell strip 40a to the copper foil 42 of solar cell strip 40b as illustrated in FIG. 3. In this way, four solar cell strips 40a, 40b, 40c, 40d were connected in series by similarly soldering the tin-plated copper wire 36 and copper foil 42 of each adjacent solar cell strips 40c, 40d.

The positive and negative electricity extraction portions of the solar cell was located close to each other on the back surface of the solar cell.

Then, as illustrated in FIGS. 4A and 4B, lamination was carried out by successively stacking a GALVALUME steel sheet 61 of 0.8 mm in thickness/EVA 62/the above solar cell elements 63 connected in series/EVA 62/a non-oriented fluororesin film "Aflex (available from Asahi Glass Co., Ltd.)" 64 of an ethylene-tetrafluoroethylene copolymer of 50 $\mu$m in thickness and melting the EVA (filler) sheets at 150° C. by a vacuum laminator, thereby making the solar cell module 60 sealed with the weather-resistant resin.

Here, the GALVALUME steel sheet 61 was preliminarily bored to form two holes 71 closely to each other (see FIG. 5) for extraction of terminals.

Incidentally, the bonding surface of the fluororesin film 64 was preliminarily subjected to a plasma processing in order to enhance adhesion to the EVA 62. The solar cell elements 63 connected in series were formed in the size slightly smaller than the GALVALUME steel sheet 61 of the back surface and the fluororesin film 64, because the edge portions of the solar cell module 60 were to be bent in a subsequent step. The tensile elongation of the fluororesin film 64 used in this example was not less than 250%.

Figure 5:
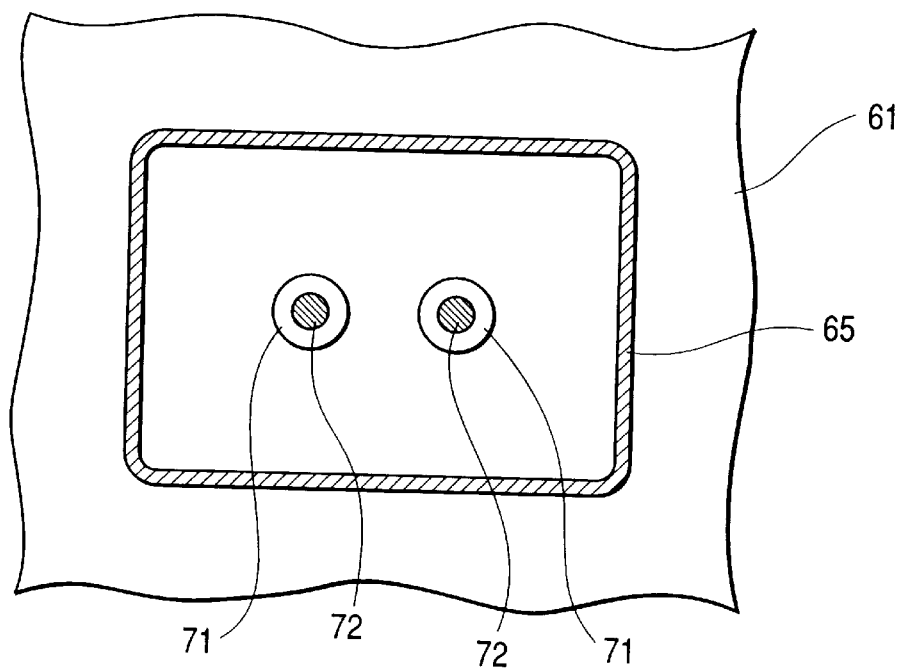
FIG. 5 is an enlarged schematic plan view showing a terminal wire part of a solar cell module.

Then, as illustrated in FIG. 5, wires 72 for the positive and negative terminals were exposed out of the two terminal extraction holes 71 bored in the GALVALUME steel sheet 61 on the back surface of the solar cell module, and thereafter a junction box 65 was attached with a silicone resin so as to cover the two terminal extraction holes 71.

This junction box 65 had holes through which connection wires for electrically connecting solar cell modules to each other were led out. A silicone packing was incorporated in the holes so as to prevent intrusion in use of water through a gap between the connection wire such as a cable, and the junction box 65.

Figure 6:
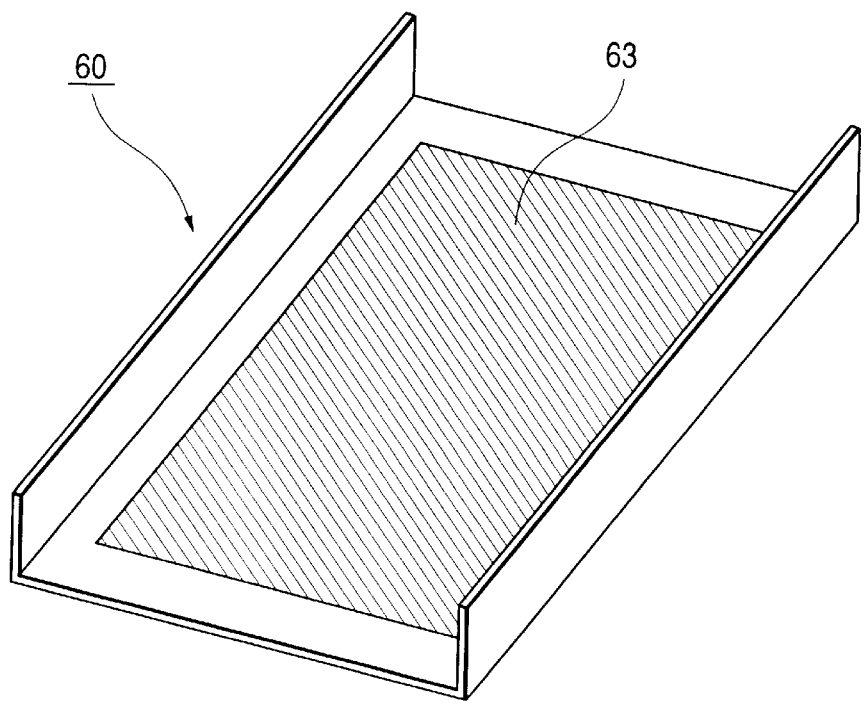
FIG. 6 is a schematic perspective view showing an example of bending of a solar cell module.

Then the edges of this solar cell module 60 were bent upward by a bending machine as illustrated in FIG. 6, thereby form the building material integrated solar cell module of the batten seam roof type.

Figure 7:
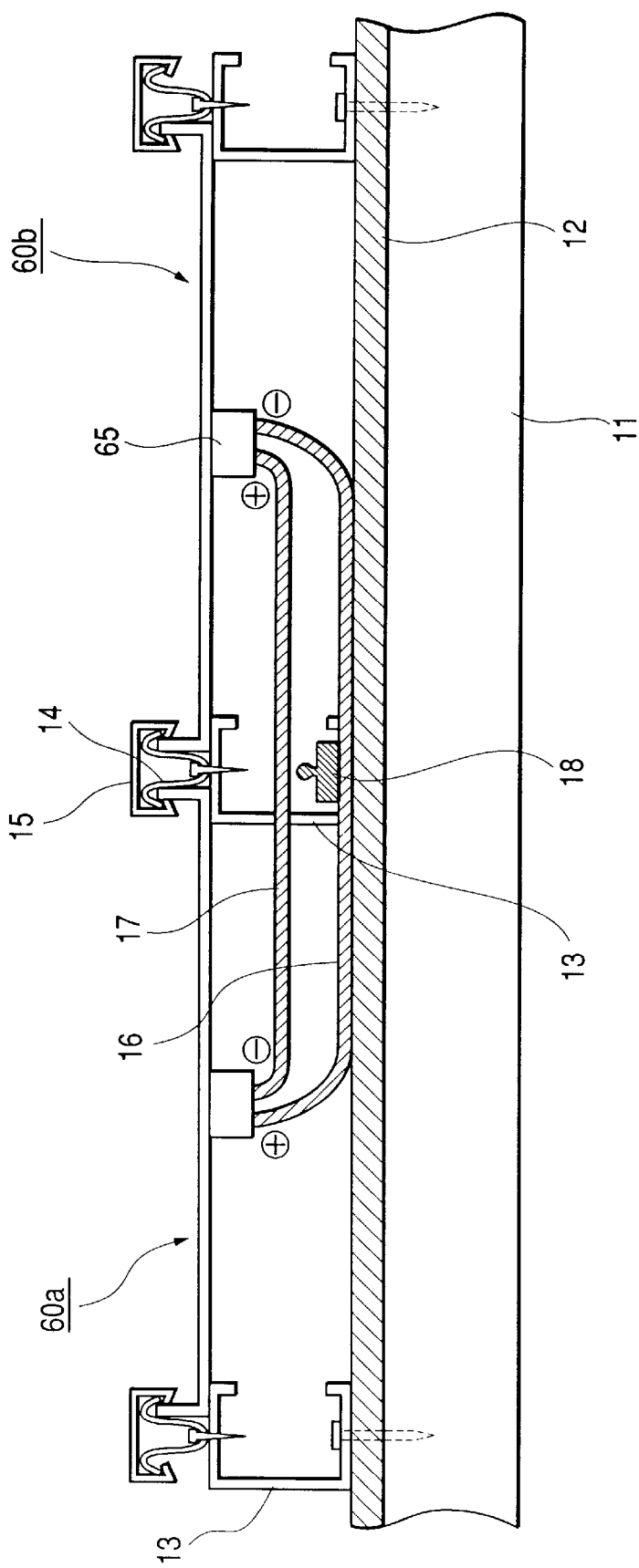
FIG. 7 is a schematic sectional view showing an example of application of solar cell modules as cladding assembly.

Then, as illustrated in FIG. 7, a base member 12 was laid on a support 11 and the two solar cell modules of the batten seam roof type described above were mounted through spacer steel members 13 of the C shape thereon, thereby producing the solar cell integrated cladding assembly of the batten seam roof type.

The solar cell modules were fixed to the spacer steel members 13 by retaining clips 14 and a cover member 15 was attached so as to cover them. The two solar cell modules 60a, 60b were electrically connected by connection wires 16 and 17.

Here, the two solar cell modules 60a, 60b were electrically connected in series. Specifically, the positive terminal of the solar cell module 60a was connected to the negative terminal of the solar cell module 60b by the connection wire 16 while the positive terminal of the solar cell module 60b was connected to the negative terminal of the solar cell module 60a by the connection wire 17.

Inside the junction box 65 a load resistor was connected between the positive back surface wire material of the solar cell module 60b and a connecting part of the connection wire 17, whereby the solar cell elements were able to operate at an operating point close to the optimum operating point.

Here, for carrying out an accelerated test assuming that the solar cell modules were exposed to the sunlight, wind, and rain over a long period on the roof, a weight 18 was put on the connection wire 16 in order to assure the contact between the connection wire 16 and the base member 12. The accelerated test was conducted as follows in this state.

(1) The solar cell integrated cladding assembly of FIG. 7 was irradiated with light under the light condition of 1 SUN for 1000 hours to promote initial deterioration of the solar cells and stabilize the performance of the solar cell modules.

(2) The initial output of the solar cell modules was measured.

(3) The solar cell integrated cladding assembly was put into a high-temperature and high-humidity chamber of a temperature 85° C. and a relative humidity 85% for 500 hours.

(4) The weight 18 was removed and the solar cell modules 60a, 60b were dismounted from the spacer steel members 13.

(5) The connection wire 16 was wound by 10000 windings around a cylinder having a diameter of 20 mm.

(6) It was put in a sunshine weatherometer of 3 SUN for 3000 hours.

(7) The output of the solar cell modules was measured after the accelerated test.

The above accelerated test was conducted for various plasticizers of the connection wires 16, 17 of the solar cell modules, and various materials for the base member 12, and a solar cell output retention rate was measured for each test. Here, the solar cell output retention rate was defined as percentage of the output of the solar cell modules after the accelerated test against the output of the solar cell modules before the accelerated test.

Specifically, crosslinked polyethylene insulated polyvinyl chloride sheath cables having a sectional area of conductor of 2 mm$^2$ and the finish outside diameter of 6.4 mm were used as the connection wires 16, 17 (electrical conductive leads) and the plasticizer contained in the polyvinyl chloride of the sheath member (jacket material) was changed among various plasticizers. Specifically, five types of systems using the various plasticizers were prepared; a system using DOP (di(2-ethylhexyl) phthalate), a system using a sebacic acid type polyester plasticizer (polyester type plasticizer) having a molecular weight of 2000, a system using tricresyl phosphate (phosphoric acid ester type plasticizer), a system using tri-n-butyl citrate (fatty acid ester type plasticizer), and a system using alkyl epoxy stearate (epoxy type plasticizer).

The amount of either plasticizer blended was 40 parts by weight per 100 parts by weight of polyvinyl chloride.

The base member used were an asphalt waterproof sheet, a polyvinyl chloride sheet, a polyurethane insulator, and a polystyrene insulator, each of which was tested in combination with the crosslinked polyethylene insulated polyvinyl chloride sheath cables of the different plasticizers described above.

The base member of the asphalt waterproof sheet was "Mitsuboshi Asphalt Roofing" available from TAJIMA ROOFING CO., LTD. The base member of the polyvinyl chloride sheet was "Hitonton" available from Matsushita Electric Works, Ltd., the base member of the polyurethane insulator was "Achilles Board" available from Achilles Corp., and the base member of the polystyrene insulator was "Kanelite Foam" available from KANEKA CORP.

The results are shown in Table 1.

TABLE 1

(Output retention percentage after the accelerated test)

| Base material | asphalt waterproof sheet | polyvinyl chloride sheet | polyurethane insulator | polystyrene insulator |
|---|---|---|---|---|
| Plasticizer of connection wire | | DOP plasticizer | | |
| Output retention rate (%) | 5% | 3% | 2% | 7% |
| Plasticizer of connection wire | | Polyester type plasticizer | | |
| Output retention rate (%) | 90% | 91% | 95% | 97% |
| Plasticizer of connection wire | | Phosphoric acid ester type plasticizer | | |
| Output retention rate (%) | 96% | 96% | 98% | 92% |
| Plasticizer of connection wire | | Fatty acid ester type plasticizer | | |
| Output retention rate (%) | 103% | 90% | 93% | 97% |
| Plasticizer of connection wire | | Epoxy type plasticizer | | |
| Output retention rate (%) | 98% | 94% | 97% | 96% |

In the system using the DOP plasticizer as a plasticizer for the polyvinyl chloride covering member, the output of the solar cell modules after the accelerated test was almost zero in the combinations with all the base materials.

Then the resistance was checked between the positive extraction portion and the negative extraction portion, and it was confirmed that a short circuit occurred between the connection wire of the positive extraction portion and the connection wire of the negative extraction portion.

The junction boxes of these solar cell modules were opened to check the inside and it was found that the terminal extraction portions of the solar cell modules were leaking to cause the short circuit of the positive and negative terminal wires 72 exposed in the terminal extraction holes 71 as illustrated in FIG. 5.

Then the short-circuited portions due to the leak in the junction boxes of the solar cell modules providing no output after the above accelerated test were fully dried with a drier and thereafter the solar cell output was measured for each.

The results are shown in Table 2.

TABLE 2

(Output retention percentage after drying with drier)

| Base material | asphalt waterproof sheet | polyvinyl chloride sheet | polyurethane insulator | polystyrene insulator |
|---|---|---|---|---|
| Plasticizer of connection wire | | DOP plasticizer | | |
| Output retention rate (%) | 78% | 83% | 80% | 82% |

The output retention rates of the solar cell modules after drying of the short-circuited portions by the drier were recovered only to about 80% as shown in Table 2.

On the other hand, in the case of the system using the sebacic acid type polyester plasticizer (polyester type plasticizer) having the molecular weight of 2000 for the polyvinyl chloride covering member, the system using tricresyl phosphate (phosphoric acid ester type plasticizer), the system using tri-n-butyl citrate (fatty acid ester type plasticizer), and the system using alkyl epoxy stearate (epoxy type plasticizer), there was observed little lowering in the output of the solar cell modules after the accelerated test, irrespective of the types of the base member. The solar cell modules providing no output after the accelerated test were investigated and it was found that the jacket material of the cables contacting the base member became considerably hard and that crazing or cracking occurred in part of the connection wires.

It is assumed from these results that the following phenomenon took place. Specifically, it is considered that in the case of the system using DOP as a plasticizer for the polyvinyl chloride connection wires, the long-term contact of the connection wires with the base member probably caused DOP of the plasticizer for the polyvinyl chloride connection wires to migrate into the base member, so as to deteriorate the polyvinyl chloride connection wires and degrade the flexibility thereof, thereby causing crazing or cracking in part of the polyvinyl chloride resin and that the accelerated test in the sunshine weatherometer assuming the long-term outdoor exposure caused water to intrude through the crack portions and the water intruded into the junction box through a gap with the jacket material of the connection wires by capillarity, thereby causing the short circuit of the solar cell module in the junction box. It is also considered that the water also intruded through the terminal holes into the solar cell elements, thereby lowering the performance of the solar cell module.

Further, in the system using the DOP plasticizer for the polyvinyl chloride covering member and using the polystyrene insulator for the base material, crazing or cracking took place in part of the connection wires and the surface of the polystyrene insulator was dissolved to be slightly depressed. This is probably because DOP of the polyvinyl chloride connection wires migrated into the polystyrene insulator to dissolve polystyrene.

On the other hand, in the case of the system using the sebacic acid type polyester plasticizer (polyester type plasticizer) having the molecular weight of 2000 as the plasticizer for the polyvinyl chloride covering member, the system using tricresyl phosphate (phosphoric acid ester type plasticizer), the system using tri-n-butyl citrate (fatty acid ester type plasticizer), and the system using alkyl epoxy stearate (epoxy type plasticizer), there was rarely occurred the migration of the plasticizer from the polyvinyl chloride covering member to the base member, irrespective of the types of the base member, so as to bring about neither cracking nor crazing of the connection wires. Therefore, these systems can provide the solar cell modules with stable performance even if they are exposed to the same conditions as those of the outdoor exposure for a long-term.

Example 2

Figure 8:
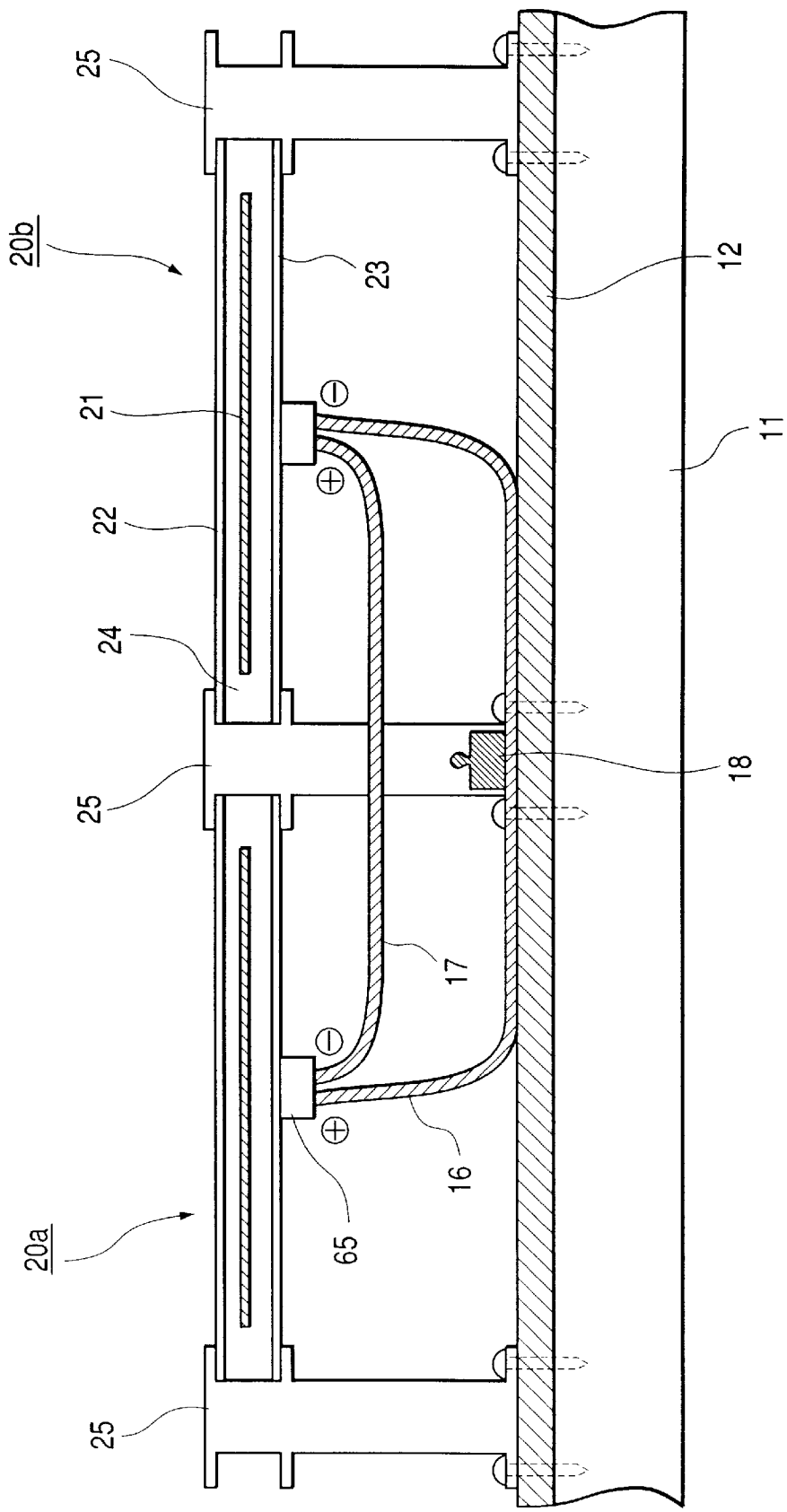
FIG. 8 is a schematic sectional view showing another example of application of a solar cell modules as a cladding assembly.

The amorphous silicon solar cells were used as solar cell elements in Example 1, whereas the present example is an example in which glass-sealed solar cell modules using crystalline solar cells were made and two such solar cell modules were set through a space on the base member of various materials, in the similar fashion to Example 1, and in which the accelerated test was conducted while a part of the cable coming out of the back surfaces of the solar cell modules was forced to touch the base member, and the performance of the solar cell modules was checked. The details will be described below referring to FIG. 8.

The solar cell elements were the single-crystal silicon solar cells. After the grid electrodes were attached thereto, two single-crystal silicon solar cell elements were connected in series. The single-crystal silicon solar cells 21 thus connected in series were sealed using a glass surface member 22, a back surface reinforcing member 23 of a moisture-resistant fluororesin in which an aluminum foil was sandwiched, and EVA 24 as a filler, thereby making a solar cell module.

The terminal extraction portions of the solar cell module were made by boring two terminal extraction holes, similar to those in Example 1, in the moisture-resistant fluororesin having the aluminum foil sandwiched (Tedlar (mfd. by Du Pont Company)/aluminum foil/Tedlar) and by leading the positive electrode and the negative electrode out thereof. The junction box 65 and connection wires 16, 17 were attached in the similar fashion to those in Example 1.

These two solar cell modules 20a, 20b were then set in a frame 25 and this frame 25 was mounted on the base member 12 and a support 11.

Electrical connection between the two solar cell modules was effected by the connection wire 16 and connection wire 17. Here, the two solar cell modules were electrically connected in series as in Example 1. The load resistor was connected in the junction box 65 as is the case with Example 1, so that the solar cells were able to operate at the operating point close to the optimum operating point.

Here, for carrying out the accelerated test assuming the conditions where the solar cell modules were exposed to the sunlight, wind, and rain outdoor on the roof or the like, the weight 18 was put on the connection wire 16 in order to assure the contact between the connection wire 16 and the base member 12. The accelerated test, similar to that in Example 1, was conducted in this state.

Here, the specific materials for the connection wires 16, 17 (electrical conductive lead) and the base member 12 were the same as those in Example 1. The results were as follows.

In the system using DOP (di(2-ethylhexyl) phthalate) as the plasticizer for the polyvinyl chloride resin of the covering member of the connection wires, all the solar cell modules were short-circuited after the accelerated test and provided little output, as in Example 1.

On the other hand, in the case of the system using the sebacic acid type polyester plasticizer (polyester type plasticizer) having the molecular weight of 2000 as the plasticizer, the system using tricresyl phosphate (phosphoric acid ester type plasticizer), the system using tri-n-butyl citrate (fatty acid ester type plasticizer), and the system using alkyl epoxy stearate (epoxy type plasticizer), there was observed no lowering in the output of the solar cell modules after the accelerated test, as in Example 1.

The solar cell modules providing no output after the accelerated test were investigated and it was found that the jacket material of the connection wires of the solar cell modules became considerably hard and that crazing or cracking took place in part of the connection wires. The junction boxes of these solar cell modules were opened to check the inside and it was confirmed that the junction extraction portions of the solar cell modules were leaking, as in Example 1, and that the short circuit occurred between the positive and negative terminal wires exposed from the terminal extraction holes.

Example 3

Solar cell modules were prepared by following the procedure of Example 2, except that the polycrystal silicon solar cell elements were used as solar cell elements, instead of the single-crystal silicon solar cell elements. Two such solar cell modules were set in the frame 25 and this frame 25 was mounted on the base member 12 and the support 11. The accelerated test was conducted in a similar fashion to that in Example 2.

The results were such that in the case of the system using DOP (di(2-ethylhexyl) phthalate) as a plasticizer for the polyvinyl chloride resin of the covering member of the connection wires, all the solar cell modules were short-circuited after the accelerated test, irrespective of the types of the base member, and provided no output.

In the combinations of the other plasticizers, little decrease was observed in the output after the accelerated test.

In the present example, the solar cell modules providing no output after the accelerated test were also investigated and it was found that the terminal extraction portions of the solar cell modules were leaking and that the electrical short circuit took place between the positive and negative terminal wires exposed from the terminal extraction holes.

Example 4

The present example is an example in which the solar cell modules were bent in the horizontal roofing shape as illustrated in FIGS. 9A and 9B, different from the bending of the solar cell modules in the batten seam roof type illustrated in FIG. 6 in Example 1, and in which a plurality of such horizontal roofing solar cell modules were mounted directly on an asphalt waterproof sheet laid on the sheathing roof board.

FIG. 9A is a schematic perspective view of a horizontal roofing type solar cell module 90 and FIG. 9B is a schematic, lateral, sectional view along the line 9B—9B of FIG. 9A. Reference numeral 91 designates a GALVALUME steel sheet having a thickness of 0.4 mm, 92 EVA, 93 amorphous silicon solar cells which are the same as those in Example 1, 94 a fluororesin film, 95 junction boxes, and 96 polyvinyl chloride cables.

Figure 10:
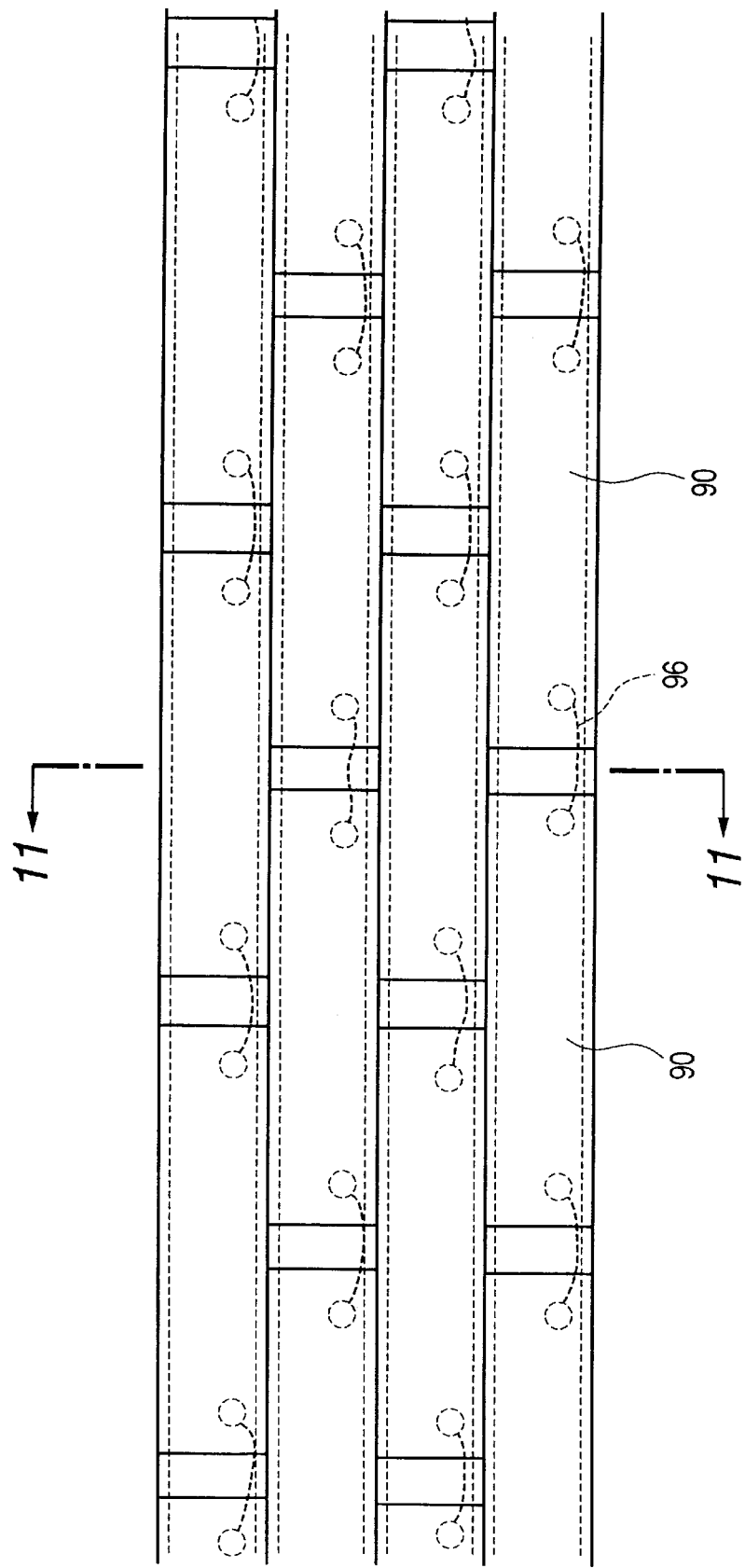
FIG. 10 is a schematic plan view showing an example where the solar cell module illustrated in FIGS. 9A and 9B is mounted in plurality to form a cladding assembly.
Figure 11:
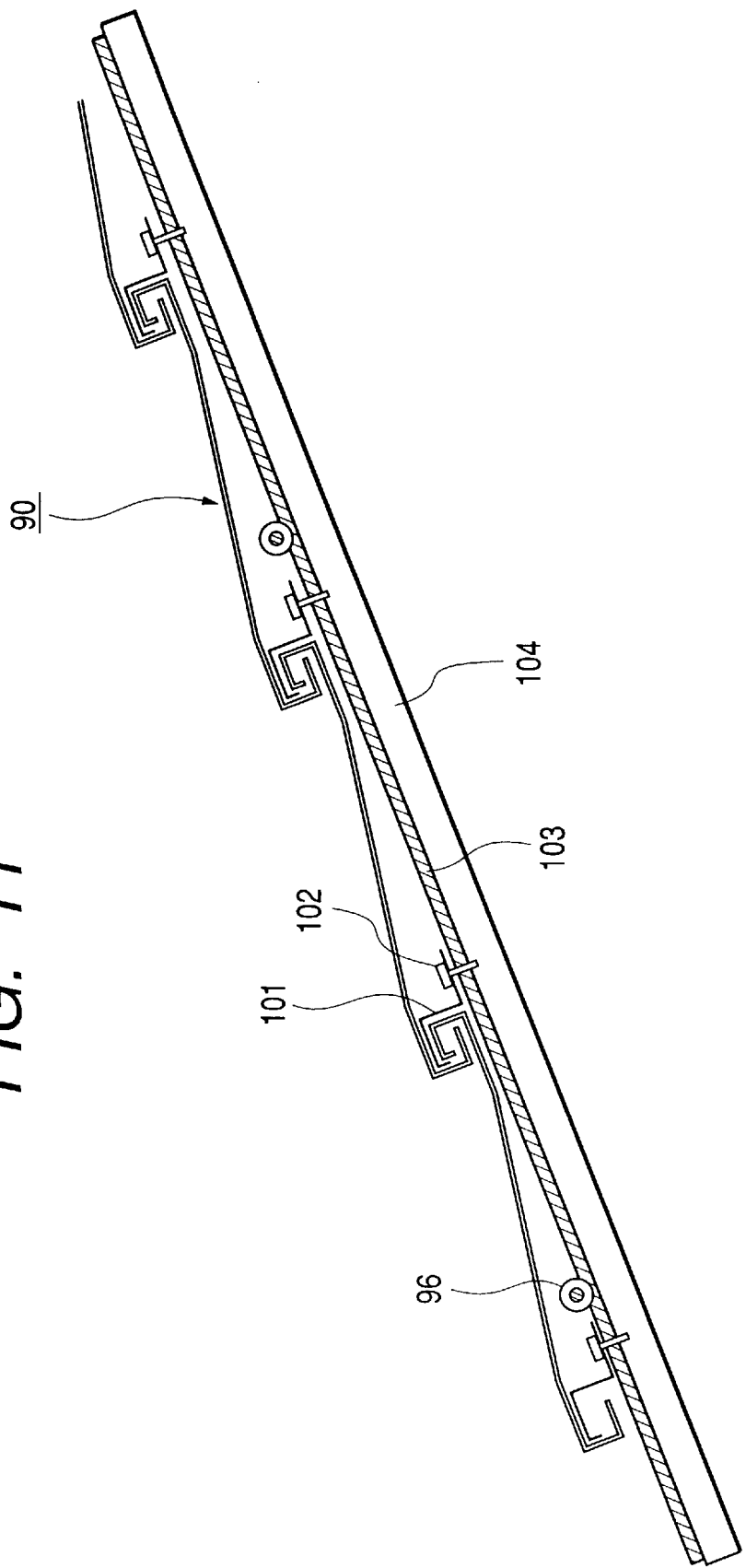
FIG. 11 is a schematic sectional view taken along the line 11—11 of FIG. 10.

FIG. 10 is a schematic top plan view of a plurality of the above horizontal roofing type solar cell modules installed, and FIG. 11 a schematic, sectional view along the line 11—11 of FIG. 10.

As illustrated in FIG. 11, the horizontal roofing type solar cell modules 90 installed above and below were fixed by retaining clips 101 of metal and the retaining clips 101 were fixed directly on the asphalt waterproof sheet 103 and sheathing roof board 104 by bolts 102.

Electrical connection between adjacent solar cell modules was effected by directly routing polyvinyl chloride cables 96 using the same polyester type plasticizer as in Example 1 as a plasticizer, on the asphalt waterproof sheet 103.

As shown in the present example, the building material integrated solar cell modules of the present invention can be directly installed on the organic waterproof sheet such as the asphalt waterproof sheet on the sheathing roof board without intervention of a frame or spacer members and the connection wires of the solar cells can be directly placed on the organic waterproof sheet by making use of the narrow space between the organic waterproof sheet and the building material integrated solar cell modules.

As detailed above, according to the solar cell modules of the present invention, by using the polyvinyl chloride type resin containing the specific plasticizer for the covering member of the electrical conductive lead, it is possible to realize the solar cell modules with excellent long-term reliability while suppressing the degradation of the electrical conductive lead and the lowering of the performance, particularly, even if the electrical conductive leads are in contact with the waterproof base member of the asphalt type resin, the polyvinyl chloride type resin, the polystyrene type resin, the polyurethane type resin, or the like. Further, since the length of the electrical conductive lead can be made large, an excessive force is prevented from being exerted on the connecting part between the solar cell body and the electrical conductive lead on the occasion of installation of the solar cell module on the base member, thereby improving the installation operability of the solar cell module.

In addition, the solar cell modules of the present invention suffer neither cracking nor crazing of the electrical conductive lead even if the electrical conductive lead is in contact with the base member over a long period outdoor, thus realizing the solar cell integrated cladding assembly with excellent long-term reliability. Further, since the building material integrated solar cell modules can be installed directly on the base member, the frame or the spacer members do not have to be used, particularly, when the solar cell modules are installed on the organic waterproof sheet such as the asphalt roofing. Therefore, the solar cell integrated cladding assembly of the new type can be constructed with excellent performance stability.

What is claimed is:

1. A solar cell module comprising a plurality of solar cell elements connected in series or in parallel, wherein a jacket material of an electrical conductive lead for electrically connecting the solar cell module with another solar cell module comprises a polyvinyl chloride resin containing at least one plasticizer other than a dialkyl phthalate plasticizer selected from the group consisting of a polyester plasticizer, a phosphoric acid ester plasticizer, a fatty acid ester plasticizer, and an epoxy plasticizer.

2. A solar cell integrated cladding assembly having mounted on a base member a plurality of solar cell modules each comprising a plurality of solar cell elements connected in series or in parallel, the plurality of solar cell modules being connected in series or in parallel by an electrical conductive lead, wherein the plurality of solar cell modules are electrically connected by the electrical conductive lead between the base member and the solar cell modules, and wherein a jacket material of the electrical conductive lead comprises a polyvinyl chloride resin containing at least one plasticizer other than a dialkyl phthalate plasticizer selected from the group consisting of a polyester plasticizer, a phosphoric acid ester plasticizer, a fatty acid ester plasticizer, and an epoxy plasticizer.

3. The solar cell integrated cladding assembly according to claim 2, wherein the base member is of a material selected from the group consisting of an asphalt resin, a polyvinyl chloride resin, a polystyrene resin, and a polyurethane resin.

4. The solar cell module according to claim 1, wherein the polyester plasticizer is selected from the group consisting of a sebacic acid polyester plasticizer, an adipic acid polyester plasticizer, and a phthalic acid polyester plasticizer.

5. The solar cell module according to claim 1, wherein the polyester plasticizer has a molecular weight of 500 to 10000.

6. The solar cell module according to claim 1, wherein the phosphoric acid ester plasticizer is selected from the group consisting of tricresyl phosphate and trioctyl phosphate.

7. The solar cell module according to claim 1, wherein the fatty acid ester plasticizer is selected from the group consisting of tri-n-butyl citrate, dioctyl adipate, dioctyl azelate, dioctyl sebacate, and methyl acetylricinoleate.

8. The solar cell module according to claim 1, wherein the epoxy plasticizer is selected from the group consisting of alkyl epoxy stearate, epoxidized soybean oil, and isodecyl 4,5-epoxytetrahydrophthalate.

9. The solar cell module according to claim 1, wherein the electrical conductive lead further comprises a connector.

10. The solar cell module according to claim 9, wherein a jacket material of the connector is selected from polyvinyl chloride resin, polyethylene resin, polyamide resin, polyvinylidene fluoride resin, chloroprene rubber, ethylene propylene rubber, silicone resin, fluororesin, modified PPO resin, modified PPE resin, nylon resin, polycarbonate resin, polybutylene terephthalate resin, and polypropylene resin.

11. The solar cell module according to claim 10, wherein the polyvinyl chloride of the jacket material for the connector contains a polyester plasticizer, a phosphoric acid ester plasticizer, a fatty acid ester plasticizer, or an epoxy plasticizer as a plasticizer of the polyvinyl chloride.

12. The solar cell module according to claim 11, wherein the polyester plasticizer of the jacket material for the connector is selected from the group consisting of a sebacic acid polyester plasticizer, an adipic acid polyester plasticizer, and a phthalic acid polyester plasticizer.

13. The solar cell module according to claim 11, wherein the polyester plasticizer of the jacket material for the connector has a molecular weight of 500 to 10000.

14. The solar cell module according to claim 11, wherein the phosphoric acid ester plasticizer of the jacket material for the connector is selected from the group consisting of tricresyl phosphate and trioctyl phosphate.

15. The solar cell module according to claim 11, wherein the fatty acid ester plasticizer of the jacket material for the connector is selected from the group consisting of tri-n-butyl citrate, dioctyl adipate, dioctyl azelate, dioctyl sebacate, and methyl acetylricinoleate.

16. The solar cell module according to claim 11, wherein the epoxy plasticizer of the jacket material for the connector is selected from the group consisting of alkyl epoxy stearate, epoxidized soybean oil, and isodecyl 4,5-epoxytetrahydrophthalate.

17. The solar cell integrated cladding assembly according to claim 2, wherein the polyester plasticizer is selected from the group consisting of a sebacic acid polyester plasticizer, an adipic acid polyester plasticizer, and a phthalic acid polyester plasticizer.

18. The solar cell integrated cladding assembly according to claim 2, wherein the polyester plasticizer has a molecular weight of 500 to 10000.

19. The solar cell integrated cladding assembly according to claim 2, wherein the phosphoric acid ester plasticizer is selected from the group consisting of tricresyl phosphate and trioctyl phosphate.

20. The solar cell integrated cladding assembly according to claim 2, wherein the fatty acid ester plasticizer is selected from the group consisting of tri-n-butyl citrate, dioctyl adipate, dioctyl azelate, dioctyl sebacate, and methyl acetylricinoleate.

21. The solar cell integrated cladding assembly according to claim 2, wherein the epoxy plasticizer is selected from the group consisting of alkyl epoxy stearate, epoxidized soybean oil, and isodecyl 4,5-epoxytetrahydrophthalate.

22. The solar cell integrated cladding assembly according to claim 2, wherein the electrical conductive lead further comprises a connector.

23. The solar cell integrated cladding assembly according to claim 22, wherein a jacket material of the connector is selected from polyvinyl chloride resin, polyethylene resin, polyamide resin, polyvinylidene fluoride resin, chloroprene rubber, ethylene propylene rubber, silicone resin, fluororesin, modified PPO resin, modified PPE resin, nylon resin, polycarbonate resin, polybutylene terephthalate resin, and polypropylene resin.

24. The solar cell integrated cladding assembly according to claim 23, wherein the polyvinyl chloride of the jacket material for the connector contains a polyester plasticizer, a phosphoric acid ester plasticizer, a fatty acid ester plasticizer, or an epoxy plasticizer as a plasticizer of the polyvinyl chloride.

25. The solar cell integrated cladding assembly according to claim 24, wherein the polyester plasticizer of the jacket material for the connector is selected from the group consisting of a sebacic acid polyester plasticizer, an adipic acid polyester plasticizer, and a phthalic acid polyester plasticizer.

26. The solar cell integrated cladding assembly according to claim 24, wherein the polyester plasticizer of the jacket material for the connector has a molecular weight of 500 to 10000.

27. The solar cell integrated cladding assembly according to claim 24, wherein the phosphoric acid ester plasticizer of the jacket material for the connector is selected from the group consisting of tricresyl phosphate and trioctyl phosphate.

28. The solar cell integrated cladding assembly according to claim 24, wherein the fatty acid ester plasticizer of the jacket material for the connector is selected from the group consisting of tri-n-butyl citrate, dioctyl adipate, dioctyl azelate, dioctyl sebacate, and methyl acetylricinoleate.

29. The solar cell integrated cladding assembly according to claim 24, wherein the epoxy plasticizer of the jacket material for the connector is selected from the group consisting of alkyl epoxy stearate, epoxidized soybean oil, and isodecyl 4,5-epoxytetrahydrophthalate.

30. A solar cell module comprising a plurality of solar cell elements connected in series or in parallel, wherein a jacket material of an electrical conductive lead for electrically connecting the solar cell module with another solar cell module is of a polyvinyl chloride resin, and wherein the polyvinyl chloride resin contains at least one plasticizer selected from the group consisting of a polyester plasticizer, a phosphoric acid ester plasticizer, a fatty acid ester plasticizer, and an epoxy plasticizer, and does not contain any other plasticizer.

* * * * *